(12) United States Patent
Qi

(10) Patent No.: US 10,107,861 B1
(45) Date of Patent: Oct. 23, 2018

(54) METHOD AND APPARATUS TO DETECT FAULTS IN ROTARY MACHINES

(71) Applicant: Xiaoyuan Qi, Rexford, NY (US)

(72) Inventor: Xiaoyuan Qi, Rexford, NY (US)

(73) Assignee: QSD Solutions LLC, Rexford, NY (US)

(*) Notice: Subject to any disclaimer, the term of this patent is extended or adjusted under 35 U.S.C. 154(b) by 0 days.

(21) Appl. No.: 15/491,976

(22) Filed: Apr. 20, 2017

(51) Int. Cl.
*G01R 31/34* (2006.01)

(52) U.S. Cl.
CPC .................. *G01R 31/346* (2013.01)

(58) Field of Classification Search
CPC .... G01R 31/34; G01R 31/343; G01R 31/346; H02P 23/14; H02P 21/08; H02P 21/16; H02P 21/22; H02P 21/24
See application file for complete search history.

(56) References Cited

U.S. PATENT DOCUMENTS

2012/0038311 A1* 2/2012 Villwock ............... G01R 31/34
318/806

* cited by examiner

*Primary Examiner* — Minh N Tang

(57) ABSTRACT

A method and an apparatus are disclosed to detect faults in a rotary machine having a rotor and at least two stator windings. The method comprises generating an input signal and applying the input signal to stator windings while the rotor is locked at a rotor position, measuring output signals from the stator windings and processing all the output signals by Fourier transform to obtain frequency responses of the stator windings, forming derived quantities from all the frequency responses so that the derived quantities are independent of the rotor position, comparing the derived quantities with corresponding reference quantities, determining that there is a fault in the rotary machine if a magnitude or phase difference between the derived quantities and the corresponding reference quantities exceeds a threshold number. The apparatus is designed to test a rotary machine using the inventive method.

6 Claims, 5 Drawing Sheets

METHOD AND APPARATUS TO DETECT FAULTS IN ROTARY MACHINES

FIELD OF THE INVENTION

The present invention relates to a method and apparatus to detect faults in a rotary machine, specifically an electric rotary machine with a rotor and at least two stators.

BACKGROUND ART

An electric rotary machine can be an electric motor or a generator.

Electric motor is widely used in both industrial and consumer products such as pumps, compressors and fans. It is important to identify any potential faults in an electric motor and maintain it in good health. The failure modes of an electric motor include stator turn-turn short, broken stator windings, stator-frame insulation breakdown, deteriorated rotor eccentricity, broken rotor bars, rotor bar-bar short, shifted shaft, and bearing defects.

Fault detection techniques of a rotary machine mainly fall into two categories, online test and offline test. Online test is to measure dynamics of a rotary machine while the rotary machine is in operation. Online test typically requires various types of sensors and the output is also vulnerable to noise. Offline test is to measure statics of a rotary machine and it is more immune to noise. Offline tests can be low voltage, medium voltage and high voltage.

Frequency response is a digital signal processing (DSP) technique to uniquely identify a system. It is like a system's fingerprint and is a powerful tool to identify abnormality in a system. IEC 60076-18 standardizes the Sweep Frequency Response Analysis (SFRA) technique to measure frequency response of power transformers to detect faults. While there are similarities between power transformers and rotary machines, there is no standard for rotary machine testing based on frequency response. Additionally, IEC 60076.-18 does not describe how to properly interpret the test data from SFRA.

The difficulty of applying frequency response method in rotary machine fault detection lies in the fact that the frequency response is dependent on the rotor position. There have been attempts to apply the SERA technique on rotary machines: L. Lamarre and P. Picher: "Impedance characterization of hydro generator stator windings and preliminary results of FRA analysis", Proc. Conf. Record 2008, IEEE Int. Syrup. Electr. Insul., pp. 227-230 (publication [1]); Martin Brandt, Slavomía Kascak: "Failure Identification of Induction Motor using SFRA Method", ELEKTRO 2016, pp 269-272 (publication. [2]). However, either the rotor has to be removed or the rotor has to be set at a known position. Further, bulky and expensive equipment has to be used. This has complicated the test and analysis, and made it difficult to implement. Thus, there remains a considerable need for methods and apparatus that can reliably and conveniently test rotary machines.

SUMMARY OF THE INVENTION

A primary object of the present invention is to provide a reliable and practical method to detect faults in electric rotary machines, eliminating the requirement that the rotary machines have to be tested at a known rotor position.

Another object of the present invention is to provide a convenient apparatus to implement the inventive method.

In a first aspect of the invention, a method to detect faults in a rotary machine having a rotor and at least two stator windings is provided. The method comprises the following steps:

generating an input signal and applying the input signal to stator windings while the rotor is locked at a rotor position, measuring output signals from the stator windings and processing all the output signals to obtain frequency responses of the stator windings at the same rotor position, forming derived quantities from all the frequency responses so that the derived quantities are independent of the rotor position, comparing the derived quantities with corresponding reference quantities, determining that there is a fault in the rotary machine if a magnitude or phase difference between the derived quantities and the corresponding reference quantities exceeds a threshold number.

The input signal comprises an arbitrary waveform including a sweeping frequency waveform, an impulse waveform, a maximum length binary sequence (MLBS) waveform and other wideband waveforms.

An advantage of the inventive method is that the rotary machine can be tested at any rotor position, which significantly simplifies the test. Furthermore, the derived quantities are independent of the rotor positon, which increases the detection sensitivity and removes the ambiguity in interpreting the data.

The reference quantity can be derived while the rotor is stationary at another position.

The reference quantity can also be derived in a different time period.

The reference quantity can be derived on a reference rotary machine as well.

Advantageously, there are multiple ways to compare a derived quantity with the corresponding reference quantity. Furthermore, there is one or more than one derived quantities to be compared, for example, there are two derived quantities for a three-phase rotary machine, which makes it more robust in deciding if there is a fault in the rotary machine. Additionally, the comparison covers a wide range of frequencies for each derived quantity. Depending on the failure mode, the derived quantity can be more sensitive at a certain frequency, which increases the sensitivity of the detection.

In a second aspect of the invention, an apparatus to detect faults in a rotary machine having a rotor and at least two stator windings is provide. The apparatus comprises at least a signal generator, an ADC, and a computing and control unit to perform the following functions:

generating an input signal and applying the input signal to stator windings while the rotor is locked at a rotor position, measuring output signals from the stator windings and processing all the output signals to obtain frequency responses of the stator windings the same rotor position, forming derived quantities from all the frequency responses so that the derived quantities are independent of the rotor position, comparing the derived quantities with corresponding reference quantities, determining that there is a fault in the rotary machine if a magnitude or phase difference between the derived quantities and the corresponding reference quantities exceeds a threshold number.

The input signal comprises an arbitrary waveform including a sweeping frequency waveform, an impulse waveform, a maximum length binary sequence (MLBS) waveform and other wideband waveforms.

An advantage of the inventive apparatus is that the rotary machine can be tested at any rotor position, which significantly simplifies the test. Furthermore, the derived quantities are independent of the rotor positon, which increases the detection sensitivity and removes the ambiguity in interpreting the data.

The reference quantity can be derived while the rotor is stationary at another position.

The reference quantity can also be derived in a different time period.

The reference quantity can be derived on a reference rotary machine as well.

Advantageously, there are multiple ways to compare a derived quantity with the corresponding reference quantity. Furthermore, there is one or more than one derived quantities to be compared, for example, there are two derived quantities for a three-phase rotary machine, which makes it more robust in deciding if there is a fault in the rotary machine. Additionally, the comparison covers a wide range of frequencies for each derived quantity. Depending on the failure mode, the derived quantity can be more sensitive at a certain frequency, which increases the sensitivity of the detection.

Numerous features, aspects, and advantages of the present invention will become more apparent from the following detailed description of a preferred embodiment of the invention, along with the accompanying drawing.

BRIEF DESCRIPTION OF THE DRAWING

To facilitate understanding embodiments of the present invention, reference is now made to the following exemplary drawing and descriptions that are not limiting the embodiments of the present invention.

DESCRIPTION OF THE PREFERRED EMBODIMENT

Figure 1:
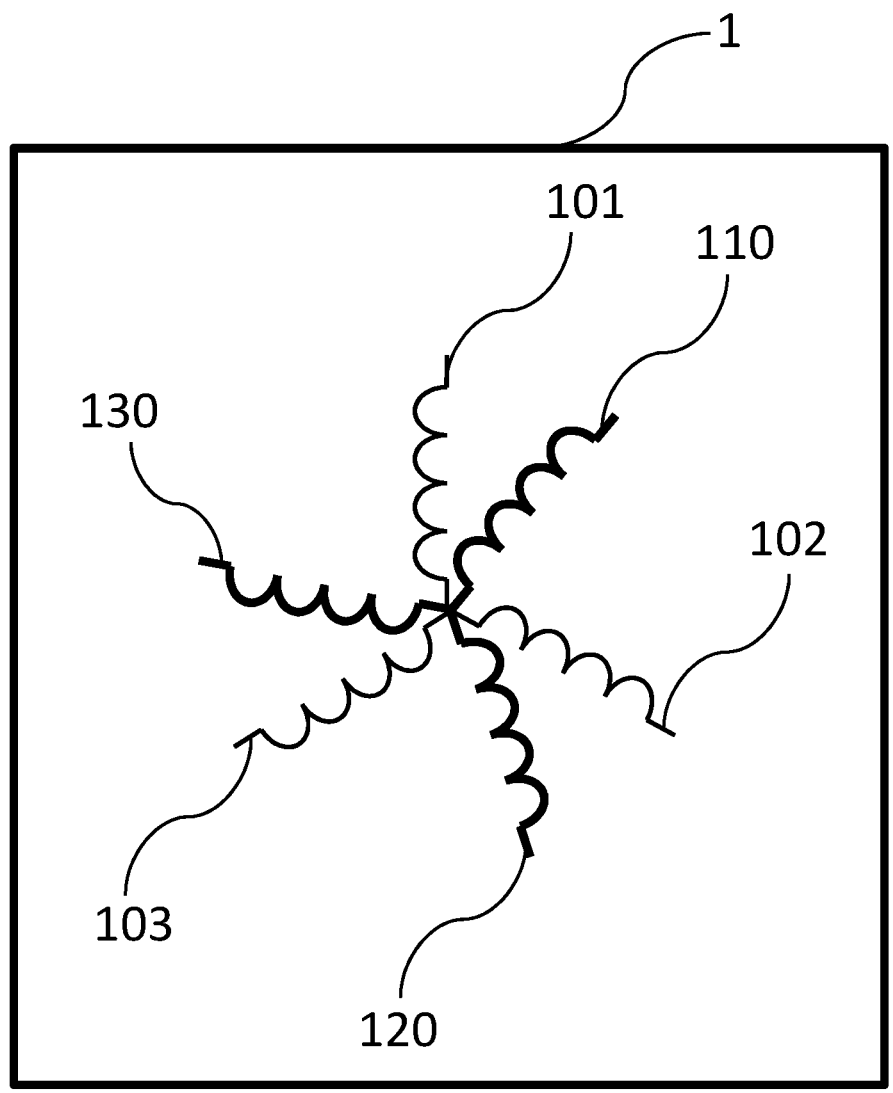
FIG. 1 shows a mathematical model. of a three-phase induction motor.
Figure 2:
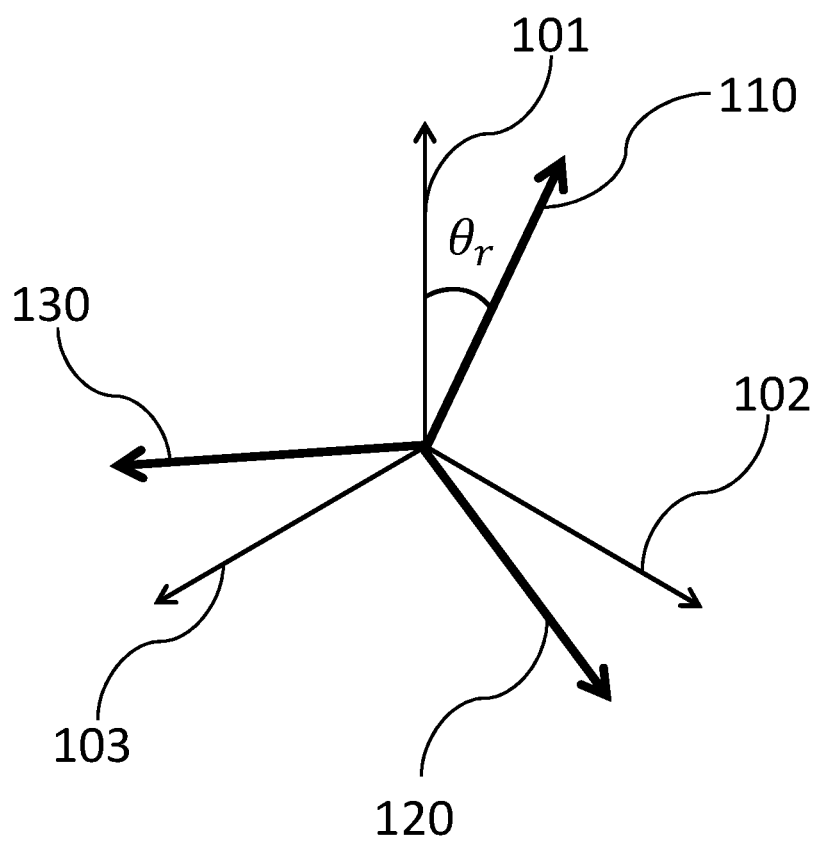
FIG. 2 shows stator and rotor magnetic axes of a three-phase induction motor.
Figure 3:
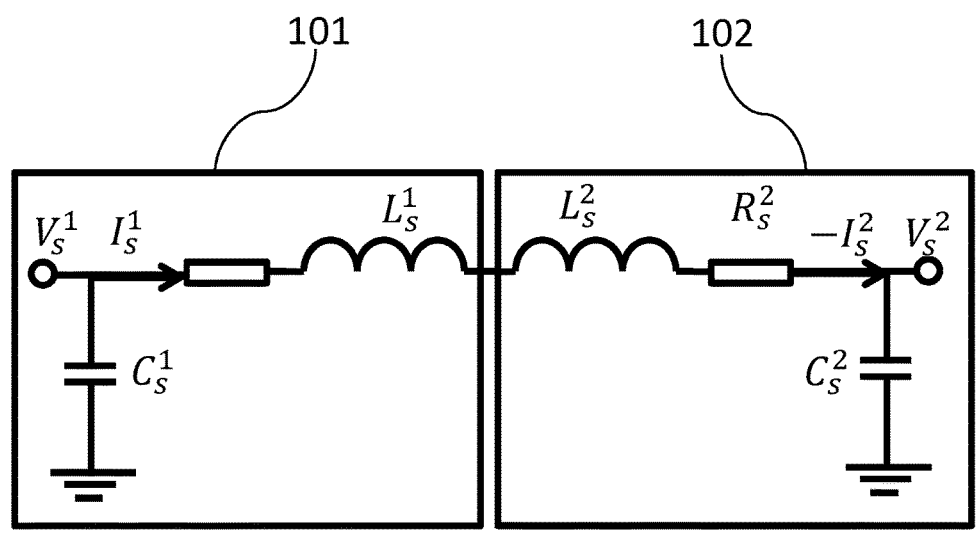
FIG. 3 shows an equivalent circuit of a pair of stator windings in a three-phase induction motor.
Figure 5:
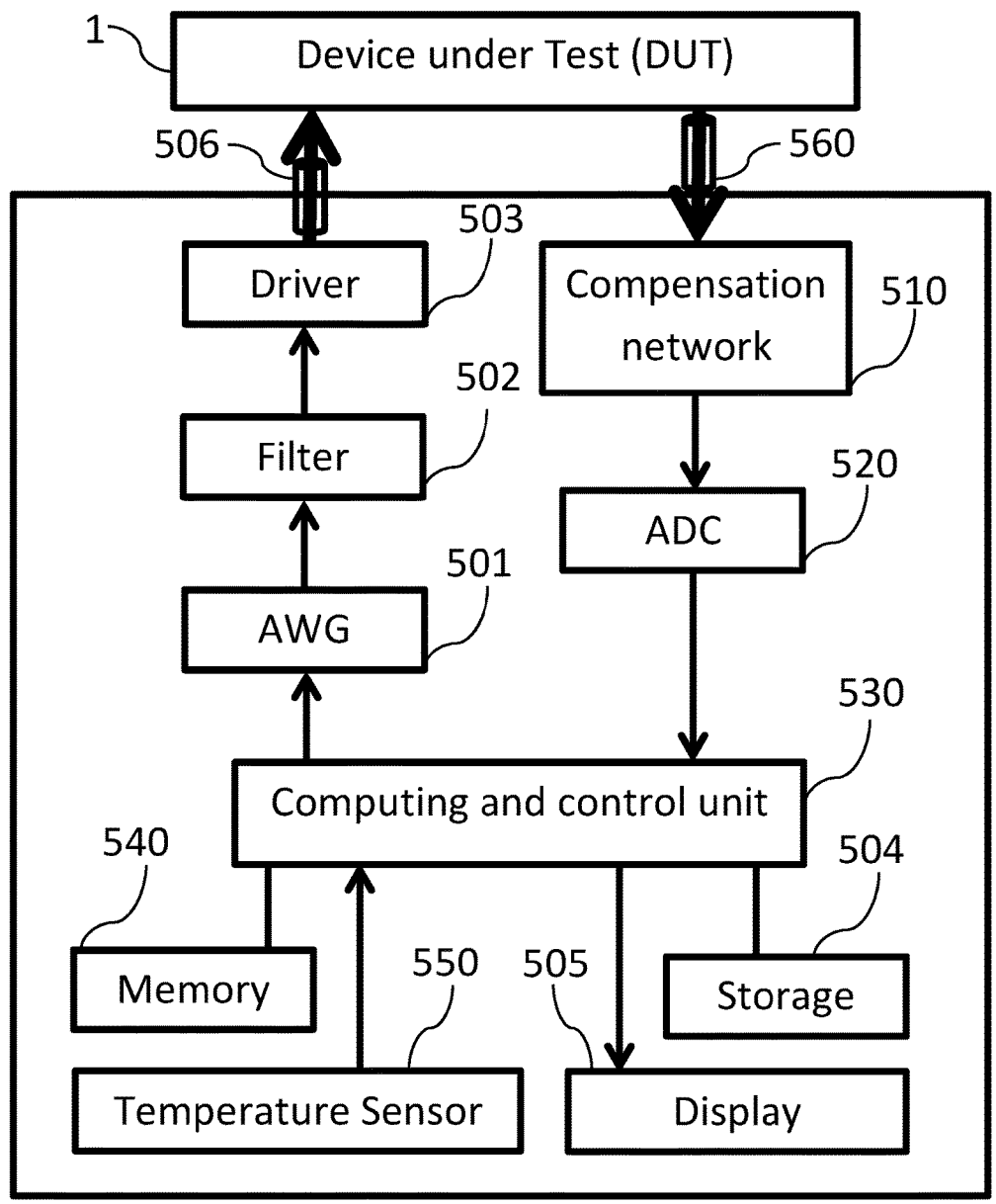
FIG. 5 shows a block diagram of a preferred embodiment of an apparatus in accordance with the invention.

In order to explain the invention, a three-phase wound-rotor induction motor has been selected to he the device under test (DUT) shown as 1 in FIG. 5. However, in the contemplated embodiments DUT can be any poly-phase motor or generator with a rotor and at least two stators. FIG. 1. shows a mathematical model of the three-phase wound-rotor induction motor, where 101, 102, and 103 are stator windings and 110, 120 and 130 are rotor windings. FIG. 2 shows magnetic axes of the three-phase wound-rotor induction motor, where the angle between stator windings 101, or 102, or 103 and the corresponding rotor windings 110, or 112, or 113 is $\theta_r$. A three-phase wound-rotor induction motor with delta connection can be easily tested by applying an input signal to a stator winding and measuring the induced current flowing through the stator winding and the voltage across the stator winding. A three-phase wound-rotor induction motor with star connection typically does not have neutral connection and can be tested by applying an input signal to a stator winding and measuring the induced current from another stator winding and the voltage across these two stator windings, which is shown in FIG. 3 by an equivalent circuit. A three-phase wound-rotor induction motor with star connection will be further discussed below and the method can be readily applied to a three-phase wound-rotor induction motor with delta connection.

During each test, the rotor is stationary and locked at an arbitrary position.

In the following, the test method and the preferred embodiment of the apparatus will be combined to describe the invention in details.

Figure 4:
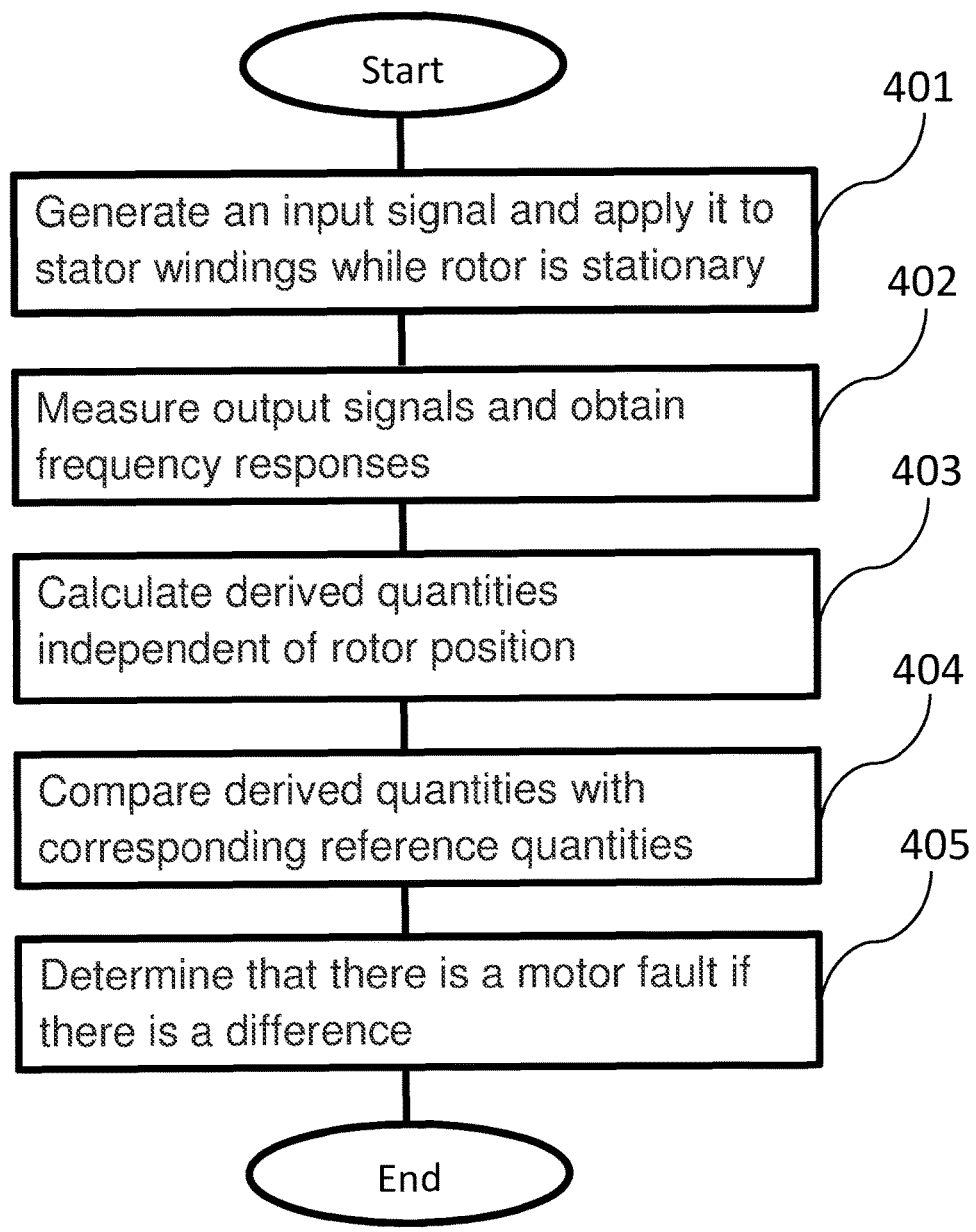
FIG. 4 shows a flow chart of a method to detect faults of a rotary machine in accordance with the invention.

In step 401 of FIG. 4, an input. signal is generated by an arbitrary waveform generator (AWG) 501 as in FIG. 5. The generated waveform is preferably a signal covering frequency range from DC to 1MHz, including a sinusoidal waveform with sweeping frequency from DC to 1.MHz and other wideband waveforms. The voltage of the input signal is preferably low voltage to medium voltage, for example a peak-to-peak voltage of 3 volts or 5 volts. The computing and control unit 530 in FIG. 5 controls the waveform generation. The generated waveform will pass through a lowpass or bandpass filter 502 and a driver 503 in FIG. 5 to improve signal integrity and drivability.

FIG. 3 shows an equivalent circuit when the stator frame is grounded, an input signal is applied to stator winding 101, the output current is measured from stator winding 102 and the voltage is measured between stator winding 101 and 102. However, it is contemplated that there are many other configurations to test the three-phase induction motor, for example, one output signal can be the induced voltage on stator winding 103. In FIG. 3 $R_s^1$ is the resistance of stator winding 101 and $R_s^2$ is the resistance of stator winding 102, $L_s^1$ is the total inductance of stator winding 101 and $L_s^2$ is the total inductance of stator winding 102, and $C_s^1$ is the stator winding-frame capacitance of stator winding 101 and $C_s^2$ is the stator winding-frame capacitance of stator winding 102. In a healthy motor, $R_s^1=R_s^2=R_s$, $L_s^1=L_s^2=L_s$ and $C_s^1=C_s^2=C_s$. The current of stator winding 101 is related to the current of stator winding 102 by $I_s^1=-I_s^2$ and the voltage between stator winding 101 and 102 equals to $V_s^1-V_s^2$.

The stator winding-frame capacitance is the dominant capacitance among all stator capacitances. Furthermore, the stator winding-frame capacitance is independent of rotor positon. Additionally, the stator winding-frame capacitance can be measured separately by applying an input signal between a stator winding and the stator frame, which is well known from prior art. Thus, the stator winding-frame capacitor can be treated separately from the total inductance and resistance.

The total inductance of a stator winding includes self-inductance of the stator winding, mutual inductance between the stator winding and other stator windings, and mutual inductance between the stator winding and rotor windings.

In FIG. 5, an input signal is applied to stator windings preferably through cable 506 with shield, including coaxial cable and triaxial cable to reduce electromagnetic interference (EMI).

In step 402 of FIG. 4, the output signals will be measured. One output signal is preferably the output current from a stator winding, for example, the output current from stator winding 102 in FIG. 3. Another output signal is preferably the voltage across stator windings, for example the voltage across stator winding 101 and 102 in FIG. 3, i.e. $V_s^1-$ $V_s^2 = V_s^{12}$, which is essentially proportional to the input signal voltage. As in FIG. 5, a compensation network 510 is connected to the stator winding by cable 560. which is preferably a cable with shield. For the output current, the compensation network 510 converts the output current into an output voltage and enhances the output voltage, which comprises two stages. The first stage comprises an array of resistors and capacitors. The computing and control unit 530 dynamically selects the resistors and capacitors to optimize the output voltage level and improve signal-to-noise ratio (SNR). One optimization method is to select the resistors and capacitors to match the DUT impedance which varies with frequency. The second stage comprises a variable-gain amplifier to amplify the output voltage signal to the desired voltage range so that the measurement accuracy is improved. The computing and control unit 530 dynamically adjust the gain in the variable-gain amplifier according to the feedback from the measurement. For the voltage across stator windings which is essentially proportional to the input signal voltage, the compensation network 510 acts as a voltage buffer.

Next the output signals are sampled and converted into digital signals by ADC 520 in FIG. 5. The ADC preferably has a sampling rate that is equal to or greater than 4MHz and a resolution that is equal to or better than 12 bits. The computing and control unit 530 in FIG. 5 controls the ADC 520, receives the digital output signals from ADC 520 and calculates the output current and the voltage across the stator windings.

A frequency response of the system can be defined as the voltage across the tested stator windings divided by the current through the stator windings, for example $$H_s^{12} = \frac{V_s^{12}}{I_s^1}$$

in FIG. 3. The frequency response is not the impedance of the stator windings only, but a characteristic quantity of both stator and rotor. The computing and control unit 530 in FIG. 5 performs the frequency response computation by using the measured voltage across stator windings and the measured output current, and separating the stator winding-frame capacitor contribution. The algorithm used is fast Fourier transform. (FFT). To fulfill the computation, the computing and control unit 530 preferably comprises a 32-bit central processing unit (CPU), a floating point unit (FPU) and at least 256K SRAM. The computing and control unit 530 can be a microcontroller or a field-programmable gate array (FPGA). To further improve performance, an external memory unit 540 may be added as in FIG. 5.

According to the. three-phase induction motor model in FIG. 1 and FIG. 2, and Kirchhoff's law, $$V_s = I_s R_s + \frac{d\phi_s}{dt}$$

$$V_r = I_r R_r = \frac{d\phi_r}{dt}$$

$$V_s = \begin{pmatrix} V_s^1 \\ V_s^2 \\ V_s^3 \end{pmatrix} \quad I_s = \begin{pmatrix} I_s^1 \\ I_s^2 \\ I_s^3 \end{pmatrix} \quad V_r = \begin{pmatrix} V_r^1 \\ V_r^2 \\ V_r^3 \end{pmatrix} \quad I_r = \begin{pmatrix} I_r^1 \\ I_r^2 \\ I_r^3 \end{pmatrix}$$

where $V_s$, is the voltage vector of stator windings, $I_s$, is the current vector of stator windings, $\emptyset_s$ is the magnetic flux vector of stator windings, $V_r$ is the voltage vector of rotor windings, $I_r$ is the current vector of rotor windings and $\emptyset_r$ is the magnetic flux vector of rotor windings. The stator winding resistor matrix and the rotor winding resistor matrix are $$R_s = \begin{pmatrix} R_s & 0 & 0 \\ 0 & R_s & 0 \\ 0 & 0 & R_s \end{pmatrix}$$

and $$R_r = \begin{pmatrix} R_r & 0 & 0 \\ 0 & R_r & 0 \\ 0 & 0 & R_r \end{pmatrix}$$

respectively.

The stator self-inductance matrix, rotor self-inductance matrix and stator-rotor mutual inductance matrix are well-known from prior art.

The stator self-inductance matrix is $$L_s = \begin{pmatrix} L_{ms} + L_{ls} & -\frac{1}{2}L_{ms} & -\frac{1}{2}L_{ms} \\ -\frac{1}{2}L_{ms} & L_{ms} + L_{ls} & -\frac{1}{2}L_{ms} \\ -\frac{1}{2}L_{ms} & -\frac{1}{2}L_{ms} & L_{ms} + L_{ls} \end{pmatrix}$$

where $L_{ms}$ is the magnetizing inductance of a stator winding and $L_{ls}$ is the leakage inductance of a stator winding.

With rotor parameters referred to stators, the rotor self-inductance matrix is $$L_r = \begin{pmatrix} L_{ms} + L_{lr} & -\frac{1}{2}L_{ms} & -\frac{1}{2}L_{ms} \\ -\frac{1}{2}L_{ms} & L_{ms} + L_{lr} & -\frac{1}{2}L_{ms} \\ -\frac{1}{2}L_{ms} & -\frac{1}{2}L_{ms} & L_{ms} + L_{lr} \end{pmatrix}$$

where $L_{lr}$ is the leakage inductance of a rotor winding.

The mutual inductance between stator and rotor is $$M_{sr} = L_{ms} \begin{pmatrix} \cos\theta_r & \cos\left(\theta_r + \frac{2}{3}\pi\right) & \cos\left(\theta_r - \frac{2}{3}\pi\right) \\ \cos\left(\theta_r - \frac{2}{3}\pi\right) & \cos\theta_r & \cos\left(\theta_r + \frac{2}{3}\pi\right) \\ \cos\left(\theta_r + \frac{2}{3}\pi\right) & \cos\left(\theta_r - \frac{2}{3}\pi\right) & \cos\theta_r \end{pmatrix}$$

where $\theta_r$ is the angle between a stator winding magnetic axis and the corresponding rotor winding magnetic axis as shown in FIG. 2.

Then we have $$\theta_s = L_s I_s + M_{sr} I_r$$

$$\theta_r = L_r I_r + M_{sr}^T I_s$$

where $M_{sr}^T$ is the transpose of $M_{sr}$.

The rotor windings are shorted. However, there is still current flowing through the rotor due to mutual inductance between stator and rotor. Thus, $$V_r^1 = V_r^2 = V_r^3$$

and $$I_r^1 + I_r^2 + I_r^3 = 0.$$

Further, during each test, one stator winding is always open without current flowing, for example stator winding 103 in the test configuration of FIG. 3. Thus, the Kirchhoff equation on stator winding 103 can be removed while stator winding 101 and 102 are being tested.

From the preceding equations, for each test according to the invention, for example the test in FIG. 3, there are five Kirchhoff equations and eight variables $V_s^1$, $V_s^2$, $I_s^1$, $I_s^2$, $I_r^1$, $I_r^2$, $I_r^3$, $\theta_r$. The eight variables can be further reduced to seven variables $V_s^1$, $V_s^{12}$, $I_s^1$, $I_r^1$, $I_r^2$, $I_r^3$, $\theta_r$ using $I_s^1 = -I_s^2$ and $V_s^1 - V_s^2 = V_s^{12}$. Thus, $V_s^{12}$ can be expressed as a function of $\theta_r$ and a $I_s^1$ via Laplace transform, $$V_s^{12} = I_s^1 (2R_s + 3sL_{ms} + 2sL_{ls}) + sI_s^1 L_{ms} \frac{3\sqrt{3} L_{ms} \sin(2\theta_r)}{\frac{R_r}{s} + \frac{3}{2} L_{ms} + L_{lr}}$$

where s is the complex variable in Laplace transform. The above equation can be easily transformed into frequency space by $s = j\omega$.

Therefore, the frequency response can be calculated, $$H_s^{12} = \frac{V_s^{12}}{I_s^1} = (2R_s + 3sL_{ms} + 2sL_{ls}) + sL_{ms} \frac{3\sqrt{3} L_{ms} \sin(2\theta_r)}{\frac{R_r}{s} + \frac{3}{2} L_{ms} + L_{lr}}$$

Similarly, the frequency responses $H_s^{23}$ between stator winding 102 and 103 and $H_2^{31}$ between stator winding 103 and 101 can be obtained.

It is apparent that the frequency response depends on rotor position angle $\theta_r$. The above frequency response is for a two-pole three-phase wound-rotor induction motor. For a three-phase wound-rotor induction motor with p pairs of poles, $\theta_r$ is replaced with $p\theta_r$ in the above frequency response expression.

In Step 403 of FIG. 4, a derived quantity is calculated from the frequency responses so that the derived quantity is independent of rotor angle $\theta_r$. There are two derived quantities $$DQ_1 = \frac{H_s^{12} + H_s^{23} + H_s^{31}}{3} = 2R_s + 3sL_{ms} + 2sL_{ls}$$

and $$DQ_2 = \sqrt{(H_s^{12} - DQ_1)^2 + \frac{(H_s^{23} - H_s^{31})^2}{3}} = sL_{ms} \frac{3\sqrt{3} L_{ms}}{\frac{R_r}{s} + \frac{3}{2} L_{ms} + L_{lr}}$$

The computing and control unit 530 calculates $H_s^{12}$, $H_s^{23}$ and $H_s^{31}$ from the measurements of $V_s^{12}$ and $I_s^1$. The computing and control unit 530 further calculates $DQ_1$ and $DQ_2$ by aforementioned equations. $DQ_1$ and $DQ_2$ are independent of rotor position and are characteristics of the three-phase induction motor.

In addition, the rotor winding position angle relative to stator winding can be obtained by $$\tan(2\theta_r) = \frac{\sqrt{3}(H_s^{12} - DQ_1)}{H_s^{23} - H_s^{31}}$$

In general, for a stator with N windings, the number of derived quantities is N-1 and the rotor position angle can be obtained simultaneously.

It is also contemplated that the inductance and resistance in $DQ_1$ and $DQ_2$ are frequency dependent, due to eddy-currents in the core, and skin and proximity effect in the windings.

An advantage of the above-mentioned method and apparatus is that a rotary machine can be tested at any rotor position, which significantly simplifies the test and apparatus design. Furthermore, $DQ_1$ and $DQ_2$ are the unique identities of the three-phase induction motor and are independent of rotor position.

In step 404 of FIG. 4, $DQ_1$ and $DQ_2$ are compared with corresponding reference quantities.

The reference quantities can be derived using the same method and apparatus while the test is done with the rotor at a different position, or the test is done in a different time period, for example right after the motor is purchased and calibrated, or the test is done on a reference motor of the same type. Therefore, there are multiple ways to compare a derived quantity with the corresponding reference quantity.

In case that there is any fault in the motor, the space symmetry of the stator or rotor is broken, which causes $DQ_1$ and $DQ_2$ to become rotor-position dependent and deviate from the reference quantities. Thus, a fault can be detected by comparing $DQ_1$ and $DQ_2$ with corresponding reference quantities. The reference quantities can be stored in an external storage 504, which is connected to the computing and control unit 530 as in FIG. 5.

Furthermore, $DQ_1$ and $DQ_2$ comprise magnitude and phase. Both of magnitude and phase are compared. In addition, the comparison covers a wide range of frequency for each derived quantity. Depending on the failure mode, the derived quantity can be more sensitive at a certain frequency, which increases the sensitivity of the detection. Thus, with multiple comparisons done on different derived quantities and across different frequencies, the fault detection is significantly more robust.

In step 405 of FIG. 4, a decision is made that there is a fault in the motor if a magnitude or phase difference of $DQ_1$ or $DQ_2$ between DUT and reference exceeds a certain threshold number.

At the end of the test, all the raw data and calculated quantities can be formatted and conveniently stored in an external storage. 504 of FIG. 5, for example a USB flash drive.

A display 505 of FIG. 5 is further used to display results and exchange information with the user. The display 505 is connected and controlled by the computing and control unit 530 as in FIG. 5.

A significant change in temperature can shift the test results. In FIG. 5 a temperature sensor 550 is connected to the computing and control unit 530, which records the temperature and saves it together with other test data.

The detailed description of the disclosure is to enable any person skilled in the art to make or use the disclosure. It is contemplated that there are various modifications of the preferred embodiment described herein, which are still within the scope of the claims of the invention. Thus, the disclosure is not limited to the preferred embodiment described herein.

What is claimed is:

1. An off-line method for detecting faults in a rotary machine having a rotor and at least two stator windings, the method comprising the steps of:
   (a) generating, with a signal generator, an input signal and applying said input signal to a stator winding or a set of stator windings of said rotary machine while said rotor is locked at a rotor position;
   (b) measuring a current and a voltage, with an ADC and a computing and control unit, from said stator winding or said set of stator windings while said rotor is locked at said rotor position;
   (c) applying Fourier transform, with said computing and control unit, to said current and said voltage to obtain a frequency response of said stator winding or said set of stator windings at said rotor position;
   (d) repeating the method from step (a)-(c) to obtain frequency responses of all stator windings or all sets of stator windings;
   (e) forming derived quantities, with said computing and control unit, from all said frequency responses so that said derived quantities are independent of said rotor position;
   (f) comparing, with said computing and control unit, a magnitude or a phase difference between said derived quantities and corresponding reference quantities;
   (g) determining, with said computing and control unit, that there is a fault in said rotary machine if said magnitude or said phase difference exceeds a threshold number.

2. The method of claim 1, wherein said input signal comprises an arbitrary waveform including a sweeping frequency waveform, an impulse waveform, a maximum length binary sequence (MLBS) waveform and other wideband waveforms.

3. The method of claim 1, wherein said corresponding reference quantities are derived on said rotary machine by following step (a)-(e) while said rotor is locked at another rotor position, or said corresponding reference quantities are derived on said rotary machine in a different time period by following step (a)-(e), or said corresponding reference quantities are derived on a reference rotary machine of the same type by following step (a)-(e).

4. An apparatus for off-line fault detection in a rotary machine having a rotor and at least two stator windings, the apparatus comprising at least a signal generator, an ADC, and a computing and control unit to perform the functions of:
   (a) said signal generator generating an input signal and applying said input signal to a stator winding or a set of stator windings of said rotary machine while said rotor is locked at a rotor position;
   (b) said ADC and said computing and control unit measuring an output signal a current and a voltage from said stator winding or said set of stator windings while said rotor is locked at said rotor position;
   (c) said computing and control unit applying Fourier transform to said current and said voltage to obtain a frequency response of said stator winding or said set of stator windings at said rotor position;
   (d) repeating step (a)-(c) to obtain frequency responses of all stator windings or all sets of stator windings;
   (e) said computing and control unit forming derived quantities from all said frequency responses so that said derived quantities are independent of said rotor position;
   (f) said computing and control unit comparing a magnitude or a phase difference between said derived quantities and corresponding reference quantities;
   (g) said computing and control unit determining that there is a fault in said rotary machine if said magnitude or said phase difference exceeds a threshold number.

5. The apparatus of claim 4, wherein said input signal comprises an arbitrary waveform including a sweeping frequency waveform, an impulse waveform, a maximum length binary sequence (MLBS) waveform and other wideband waveforms.

6. The apparatus of claim 4, wherein said corresponding reference quantities are calculated on said rotary machine by following step (a)-(e) while said rotor is locked at another rotor position, or said corresponding reference quantities are calculated on said rotary machine in a different time period by following step (a)-(e), or said corresponding reference quantities are calculated on a reference rotary machine of the same type by following step (a)-(e).

* * * * *